(12) United States Patent
Wang et al.

(10) Patent No.: US 8,545,241 B2
(45) Date of Patent: Oct. 1, 2013

(54) USB FLASH DRIVE

(75) Inventors: Rong-Hao Wang, Guangdong (CN); Ru-Jian Lin, Guangdong (CN)

(73) Assignees: Premier Image Technology (China) Ltd., Foshan (CN); Hon Hai Precision Industry Co., Ltd., New Taipei (TW)

( * ) Notice: Subject to any disclaimer, the term of this patent is extended or adjusted under 35 U.S.C. 154(b) by 129 days.

(21) Appl. No.: 13/340,599

(22) Filed: Dec. 29, 2011

(65) Prior Publication Data

US 2013/0102166 A1 Apr. 25, 2013

(30) Foreign Application Priority Data

Oct. 21, 2011 (CN) .......................... 2011 1 0322922

(51) Int. Cl.
*H01R 13/44* (2006.01)

(52) U.S. Cl.
USPC ........................................................ 439/131

(58) Field of Classification Search
USPC ................ 439/660, 131, 133, 135, 140, 141, 439/122, 149, 353, 358, 638, 680; 361/752, 361/737, 631, 754
See application file for complete search history.

(56) References Cited

U.S. PATENT DOCUMENTS

| 6,808,400 | B2 * | 10/2004 | Tu ................................. | 439/131 |
| 7,416,423 | B2 * | 8/2008 | Chi et al. ...................... | 439/131 |
| 8,029,303 | B2 * | 10/2011 | Chiang ......................... | 439/172 |
| 2006/0073717 | A1 * | 4/2006 | Ng et al. ...................... | 439/131 |
| 2008/0192149 | A1 * | 8/2008 | Lee ............................... | 348/725 |
| 2010/0075517 | A1 * | 3/2010 | Ni et al. ....................... | 439/131 |
| 2010/0221937 | A1 * | 9/2010 | Choi et al. ................... | 439/142 |

FOREIGN PATENT DOCUMENTS

CN 2796172 Y 7/2006

* cited by examiner

*Primary Examiner* — Tho D Ta
*Assistant Examiner* — Harshad Patel
(74) *Attorney, Agent, or Firm* — Altis & Wispro Law Group, Inc.

(57) ABSTRACT

A USB flash drive includes a USB connector, a latch, and a socket. The USB connector is rotatably connected to the socket and includes a first spring to drive the USB connector to rotate from a folded state in which the USB connector is received in the socket, to an unfolded state in which the USB connector is out of the socket. The latch is positioned in the socket and includes a sliding cap and a second spring. The second spring is configured for driving the sliding cap to slide towards the USB connector when in the folded state, to latch the USB connector. The latch also includes a restraining rod and a third spring. The restraining rod is configured for restraining the sliding cap in the unfolded state under the control of the third spring but when in the folded state releases the sliding cap when pressed by the USB connector.

19 Claims, 6 Drawing Sheets

USB FLASH DRIVE

BACKGROUND

1. Technical Field

The present disclosure relates to a universal serial bus (USB) flash drive.

2. Description of Related Art

USB flash drives include a USB connector for inserting into a USB interface and thus connecting the USB flash drives to an electronic device. The USB connector, when not used, is exposed to dust and moisture and other contaminants, and thus may be polluted, degrading the connectivity and performance thereof.

Therefore, it is desired to provide a USB flash drive, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

Moreover, in the drawings, like reference numerals designate corresponding parts throughout the views.

DETAILED DESCRIPTION

Embodiments of the present disclosure will be described with reference to the drawings.

Figure 1:
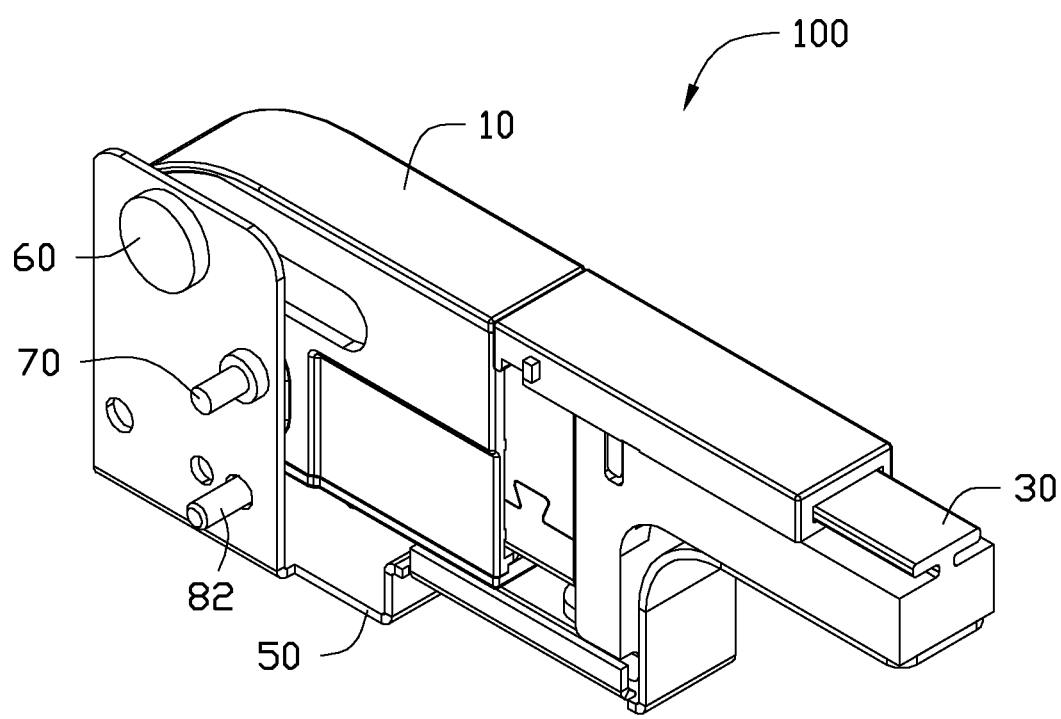
FIG. 1 is an isometric and schematic view of a USB flash drive, according to an embodiment.
Figure 2:
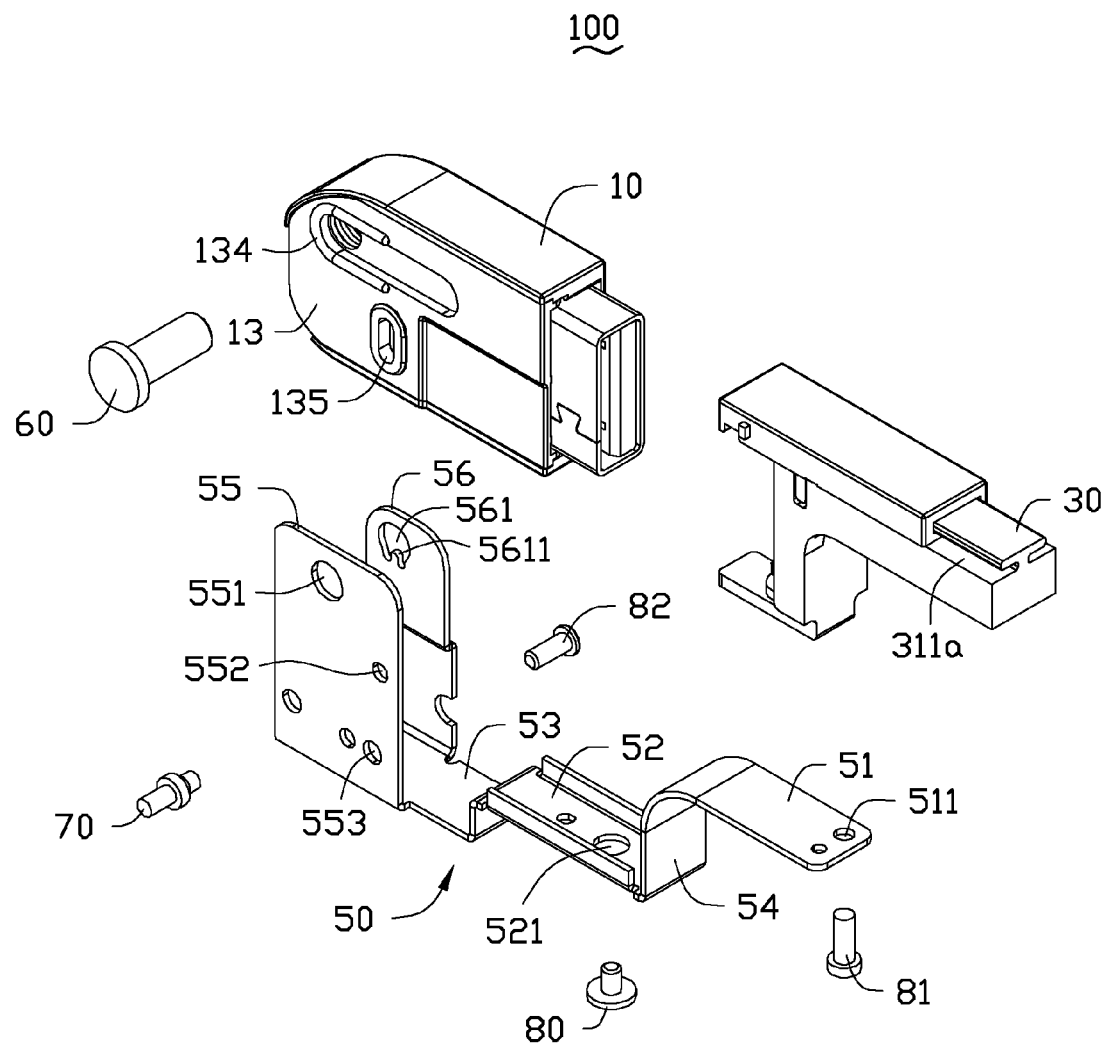
FIG. 2 is an isometric, exploded, and schematic view of the USB flash drive of FIG. 1, according to the embodiment.

Referring to FIGS. 1-2, a USB flash drive 100, according to an embodiment, includes a USB connector 10, a latch 30, and a socket 50, a first bolt 60, a second bolt 70, a first fastener 80, a second fastener 81, and a third fastener 82.

Figure 3:
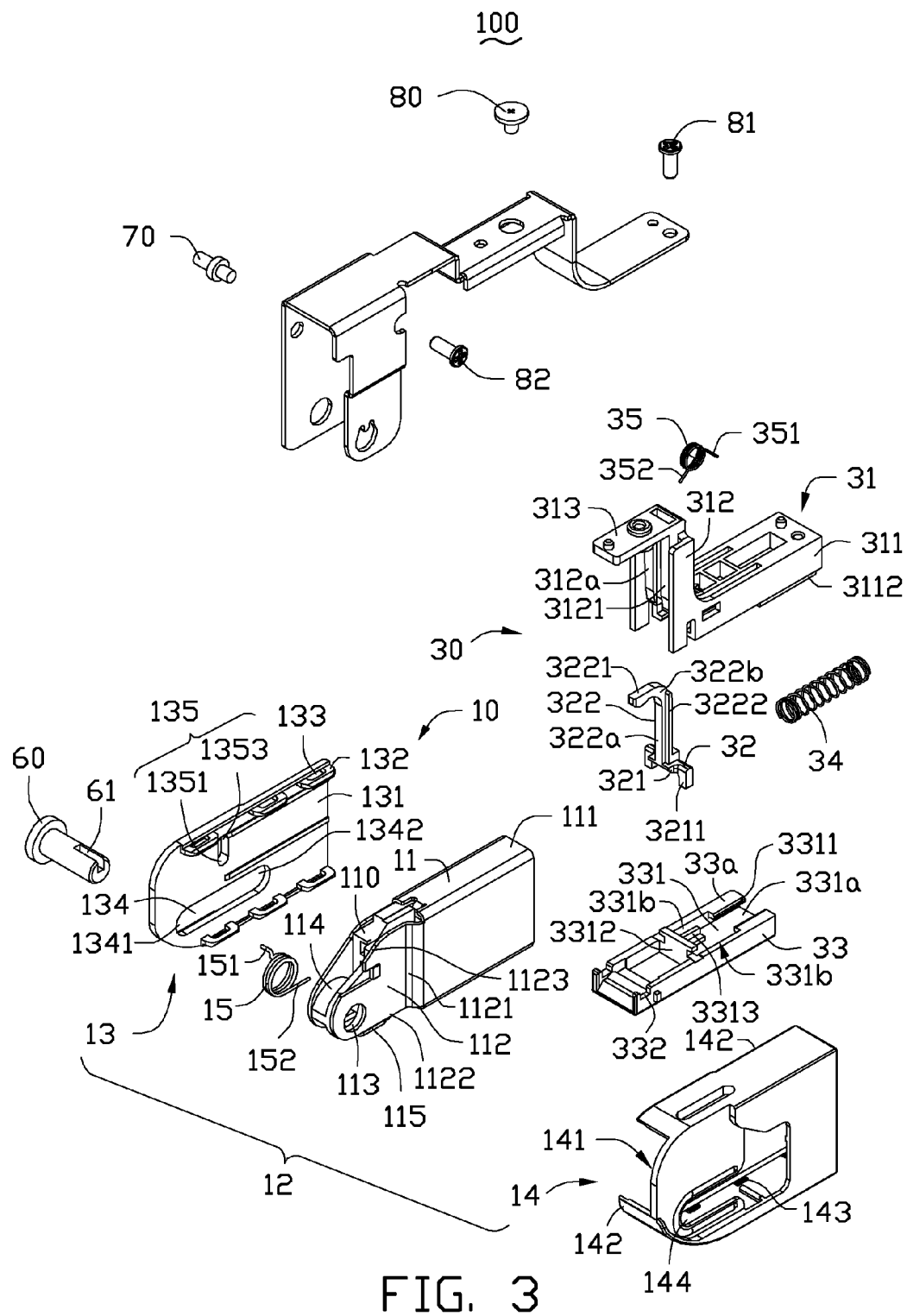
FIG. 3 is another isometric, exploded, and schematic view of the USB flash drive of FIG. 1, according to the embodiment.

Also referring to FIG. 3, the USB connector 10 includes a body 11, a shell 12, and a first spring 15.

The body 11 is substantially a rectangular block and includes a back end 110 and a front end 111. The front end 111 is used to plug into a USB interface of an electronic device (not shown), thus connecting the USB flash drive 10 to the electronic device.

The body 11 also includes two parallel connecting plates 112 protruding from the back end 110. Each connecting plate 112 is generally in a right-angle triangle shape and includes a first right-angle side 1121, a second right-angle side 1122, and a long side (hypotenuse 1123). The first right-angle sides 1121 are connected to the back end 110. Each connecting plate 112 defines a first shaft hole 113 at an intersecting corner of the second right-angle side 1122 and the hypotenuse 1123. The first shaft holes 113 are aligned with each other.

The body 11 further includes a first limiting plate 114 and a second limiting plate 115. The first limiting plate 114 is semi-circular, and is positioned between the connecting plates 112, and encloses a half circumference of each first shaft hole 113 that is distant from the back end 110. The second limiting plate 115 is a flat plate, and is positioned between the connecting plates 112, and perpendicularly connects the two second right-angle sides 1122, in close proximity to the first shaft holes 113.

The shell 12 is configured for enclosing the body 11 and includes a first part 13 and a second part 14.

The first part 13 is substantially a rectangular plate and includes a rectangular first surface 131 and a number of ears 132 perpendicularly extending up from two long sides of the first surface 131. Each ear 132 defines an engaging groove 133 that extends along a direction that is substantially parallel to the long sides of the first surface 131.

The first part 13 also defines a first slot 134 and a second slot 135. The first slot 134 is positioned adjacent to a corner of the first part 13, extending in a direction that is substantially parallel to the lengthwise direction of the first surface 131, and forms a first rounded end 1341 closing the corner of the first part 13 and a second rounded end 1342 opposite to the first rounded end 1341. The second slot 135 is positioned adjacent to one of the long sides of the first surface 131 that is distant from the first slot 134 and extends in a direction that is substantially perpendicular to the long sides of the first surface 131. The second slot 135 forms a third rounded end 1351 adjacent to the first slot 134 and a fourth rounded end 1353 opposite to the third rounded end 1353.

The second part 14 includes a bottom plate 141 and two sidewalls 142. The bottom plate 141 is essentially similar to the first surface 131 in shape and size. The sidewalls 142 extend up from the two long sides of the bottom plate 141. The second part 14 also includes a number of engaging protrusions 143 protruding from the sidewalls 142 and configured for engaging with the engaging grooves 133. The bottom plate 141 defines a third slot 144 that corresponds to the first slot 134 in position, shape, and size.

The first spring 15 is a coil torsion spring and includes a first longitudinal end 151 and a first transverse end 152 substantially perpendicular to the first longitudinal end 151.

Figure 4:
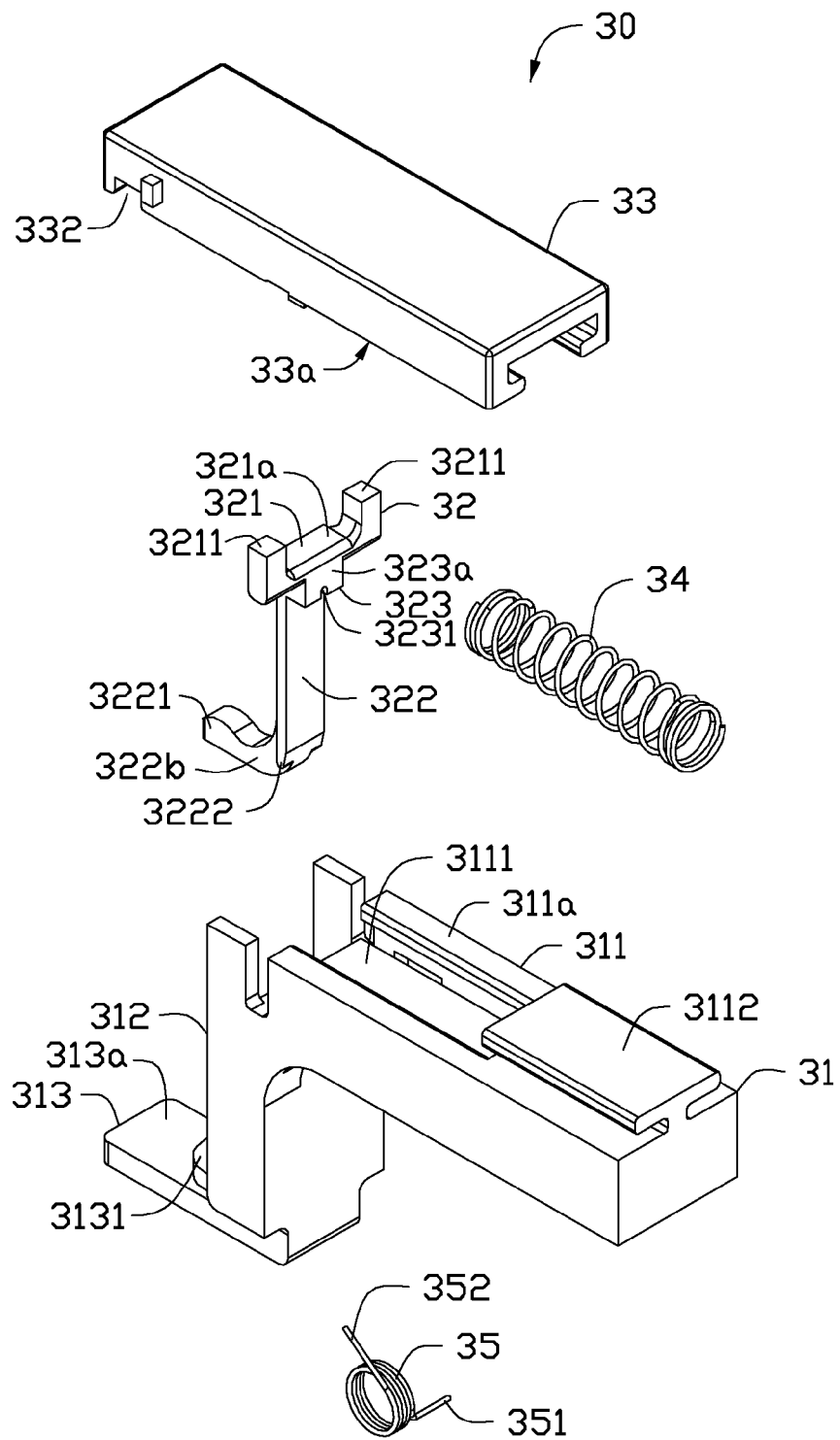
FIG. 4 is an isometric, exploded, and schematic view of a latch of the USB flash drive of FIG. 1, according to the embodiment.
Figure 5:
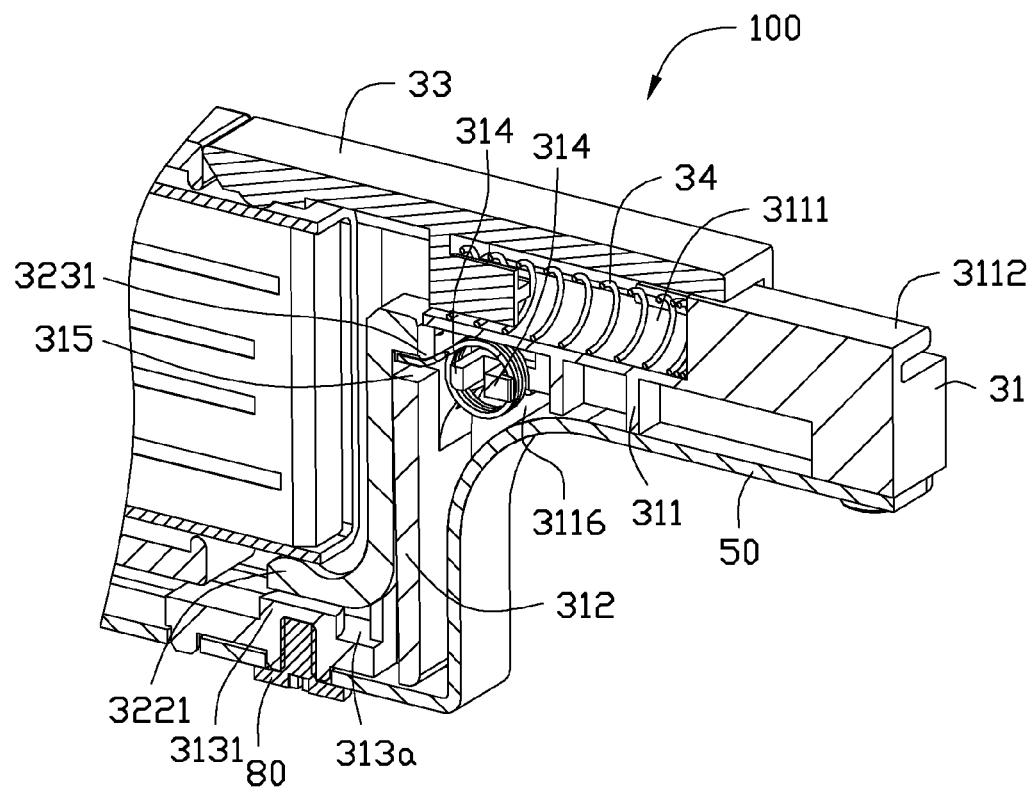
FIG. 5 is a partial, cross-sectional, schematic view of the USB flash drive of FIG. 1, according to the embodiment.
Figure 6:
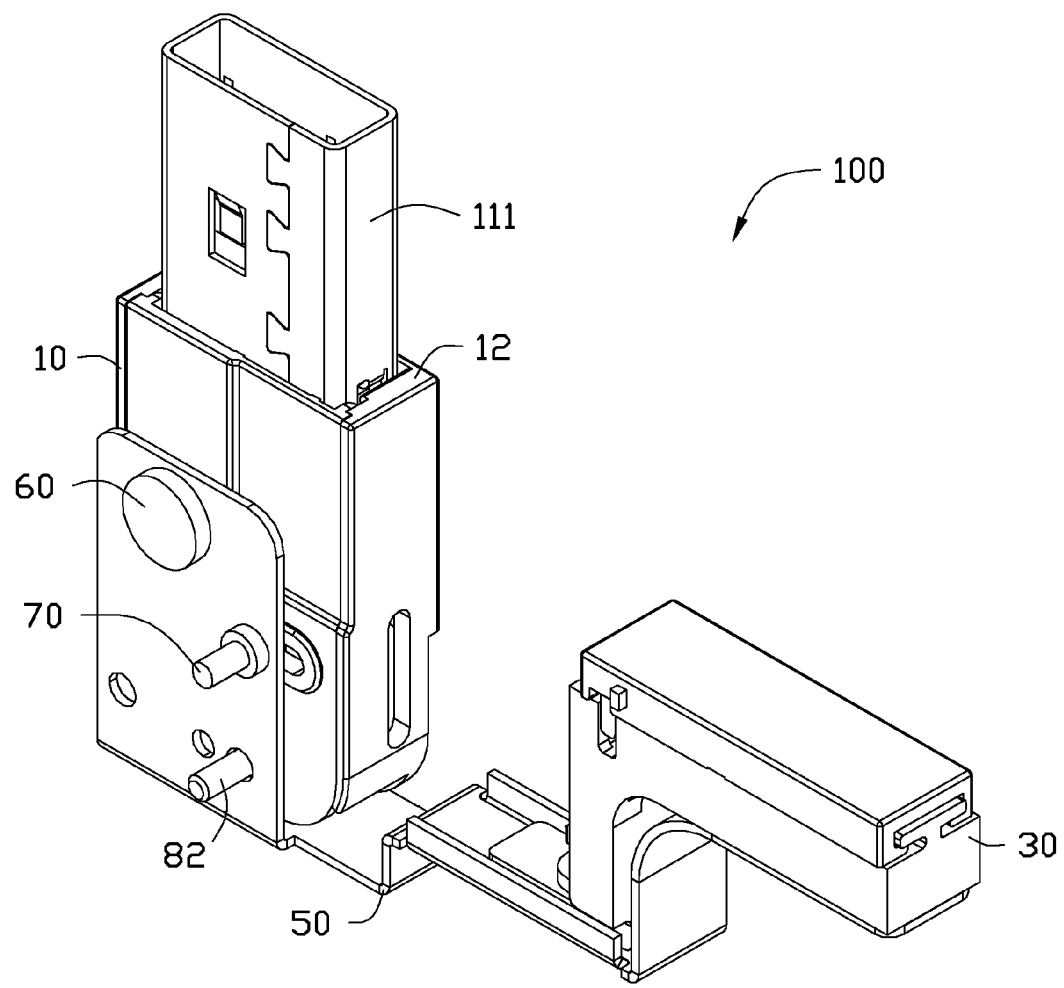
FIG. 6 is similar to FIG. 1, but showing the USB flash drive in another state.

Referring to FIGS. 3-5, the latch 30 includes a base 31, a restraining rod 32, a sliding cap 33, a second spring 34, and a third spring 35.

The base 31 includes a first block 311, a second block 312, and a third block 313, all of which are rectangular. The second block 312 extends up from an end of the first block 311, and the third block 313 extends up from an end of the second block 312 that is distant from the first block 311 and extends away from the first block 311.

The first block 311 includes a second surface 311a facing away from the third block 313 which defines a first receiving groove 3111 in the second surface 311a, adjacent to the second block 312. The first block 311 also includes a rail 3112, protruding from the second surface 311a away from the second block 312. The first receiving groove 3111 is adjacent to the second block 312, generally at a central portion of the width of the second surface 311a. The first receiving groove 3111 runs lengthwise along the first block 311 and out of the first block 311. The rail 3112 is T-shaped in cross section. The rail 3112 is positioned away from the second block 312, generally at the central portion of the width of the second surface 311a, and extends lengthwise along the first block 311.

The second block 312 includes a third surface 312a that is substantially perpendicular to the second surface 311a and faces away from the first block 311. The second block 312 defines a second receiving groove 3121 in the third surface 312a. The second receiving groove 3121 extends through the second block 312, lengthwise along the second block 312 and generally at a central portion of the width of the third surface 312a, and is thus communicating with the first receiving groove 3111.

The third block 313 includes a fourth surface 313a that perpendicularly connects with the third surface 312a and includes a fastener-receiving portion 3131 extending up from the fourth surface 313a, adjacent to the second block 312 and at a central portion of the width of the fourth surface 313a.

The first block 311 is hollow and defines a cavity 3116. The cavity 3116 is located beneath the first receiving groove 3111 at an intersection of the first and second blocks 311, 312. The base 31 also includes two holding pins 314 received in the cavity 3116 and extending up from an inner wall of the cavity 3116, adjacent to the intersection of the first block 311 and the second block 312. The holding pins 314 extend in a direction substantially parallel to a line of the intersection of the first block 311 and the second block 312.

The second block 312 is also hollow. The base 31 also defines an opening 315 in the third surface 312a, which communicates with the interior of the second block 312 and the cavity 3116, adjacent to the intersection of the first block 311 and the second block 312 opposite to the second surface 311a and the third surface 312a.

The sliding cap 33 is generally a rectangular block, shaped and sized to correspond to the first block 311. The sliding cap 33 includes a fifth surface 33a and defines a third receiving groove 331 in the fifth surface 33a. The third receiving groove 331 is rectangular and runs through the sliding cap 33 in a lengthwise direction. The third receiving groove 331 is bounded by and forms a bottom surface 331a substantially parallel to the fifth surface 33a and two side surfaces 331b extending up from the two long sides of the bottom surface 331a. The sliding cap 33 also includes two riding protrusions 3311 protruding from the respective side surfaces 331b, aligning with the edges of the side surfaces 331b which are distant from the bottom surface 331a and adjacent to an end of the sliding cap 33. The sliding cap 33 also includes a separating plate 3312 positioned generally at a central portion of the length of the third receiving groove 331, perpendicularly connecting the bottom surface 331a and the two side surfaces 331b. The sliding cap 33 also includes a holding rod 3313 extending up from the separating plate 3312 toward the riding protrusion 3311, in a direction substantially perpendicular to the separating plate 3312 and the holding rod 3313 has a "+" shaped cross section. The sliding cap 33 also defines a restraining groove 332 in the fifth surface 33a, adjacent to an end that is distant from the riding protrusions 3311. The restraining groove 332 is elongated and extends through the sliding cap 33 in a direction substantially perpendicular to the lengthwise direction of the third receiving groove 331.

The restraining rod 32 is substantially T-shaped and includes a first rod 321 and a second rod 322 extending up from a central portion of the first rod 321.

The first rod 321 includes a sixth surface 321a and two restraining blocks 3211. The sixth surface 321a is rectangular and faces away from the second rod 322. The two restraining blocks 3211 extend up from the two lengthwise ends of the sixth surface 321a.

The second rod 322 includes a seventh surface 322a and a pressing block 3221. The seventh surface 322a is rectangular, and substantially perpendicular to the sixth surface 321a. The pressing block 3221 extends up from a lengthwise end of the seventh surface 322a distant from the first rod 321. The second rod 322 also includes two eighth surfaces 322b and two wings 3222. The two eighth surfaces 322b are substantially perpendicular to the sixth surface 321a and perpendicularly connect to the seventh surface 322a. The two wings 3222 extend up from the respective eighth surfaces 322b.

The restraining rod 32 also includes a connecting block 323. The connecting block 323 is positioned at an intersection between the first rod 321 and second rod 322 opposite to the seventh surface 322a. The connecting block 323 is rectangular and includes a ninth surface 323a opposite to the seventh surface 322a and defines a limiting groove 3231 in a central portion of an edge of the ninth surface 323a distant from the first rod 321 and the second rod 322. The limiting groove 3231 extends in a direction substantially perpendicular to the ninth surface 323a.

The second spring 34 is a coil spring.

The third spring 35 is a coil torsion spring and includes a second longitudinal end 351 and a second transverse end 352 which is perpendicular to the second longitudinal end 351.

Referring to FIG. 2, the socket 50 is ladder-shaped and includes a first rung 51, a second rung 52, and a third rung 53, which are all rectangular and arranged from top to bottom. The socket 50 also includes connecting pieces 54 connecting the first rung 51 and second rung 52, and second rung 52 and third rung 53.

The socket 50 also includes a first support plate 55 and a second support plate 56 extending up from the two long sides respectively of the third rung 53. The first support plate 55 and the second support plate 56 are both rectangular and the lengthwise directions thereof are both substantially perpendicular to the third rung 53. The first support plate 55 defines a second shaft hole 551 and a third shaft hole 552. The second shaft hole 551 is positioned away from the third rung 53 in the lengthwise direction of the first support plate 55 and generally at a central portion across the first support plate 55. The third shaft hole 552 is positioned adjacent to the second rung 52 across the first support plate 55 and generally at a central portion of the length of the support plate 55. The second support plate 56 defines a fourth shaft hole 561 which is aligned with the second shaft hole 551 and includes a tongue 5611 extending into the third shaft hole 561 from a side adjacent to the third rung 53 and toward the side that is farthest away from the third rung 53. The second rung 52 defines a first threaded hole 521. The first rung 51 defines a second threaded hole 511.

Referring to FIGS. 3-5, the first bolt 60 defines a loading groove 61.

The second bolt 70 is a stepped rod.

The first fastener 80, the second fastener 81, and the third fastener 82 are screws.

In assembly, the first spring 15 is placed into a space which is defined by the first limiting plate 114 and the second limiting plate 115 and aligned with the first shaft holes 113. The first transverse end 152 abuts against the second limiting plate 115. The first part 13 and the second part 14 are combined by engaging the engaging protrusions 143 with the engaging grooves 133 so as to enclose the body 11 within. The first shaft hole 113 is aligned with the first rounded end 1341 and an end of the third slot 144 corresponding to the first rounding end 1341. The first longitudinal end 151 protrudes out of the first shaft hole 13 and into the first rounded end 1341.

The third spring 35 is received in the cavity 3116 and coiled around the holding pins 3014. The second longitudinal end 351 abuts the first block 31. The second transverse end 352 protrudes out of the opening 315. The second rod 322 with the wings 3222 is received in the second receiving groove 3121, and the first rod 321 is positioned adjacent to the first block 31. The second transverse end 352 is limited within the limiting groove 3231. The second spring 34 is placed into the first receiving groove 3111. The sliding cap 33 slidably caps on the first block 311 by mounting the riding protrusions 3311 on the rail 3112. The holding rod 3313 inserts into one end of the second spring 34 and thus holds the second spring 34.

The latch 30 is put into the socket 50. The first block 311 is positioned on the first rung 51 and fixed thereto by inserting the second fastener 81 through the second threaded hole 511 and into the first block 311. The third block 313 is positioned on the second rung 52 and fixed thereto by inserting the first fastener 80 through the first threaded hole 521 and into the fastener-receiving portion 3131.

The USB connector 10 is put into the socket 50, between the first support plate 54 and the second support plate 55. The first bolt 60 is inserted through the second shaft hole 551, the first slot 134, the first shaft hole 113, the first spring 15, the third slot 144, and the fourth shaft hole 561. The first longitudinal end 151 and the tongue 5611 are engaged in the loading groove 61. The second bolt 70 is inserted through the third shaft hole 552 and into the second slot 135.

The third fastener 82 is inserted into the fixing hole 553, fixing the USB connector 10 to the socket 50.

In operation, the USB flash drive 100 can be in a folded state (see FIG. 1) when not used and in an unfolded state (see FIG. 5) when in use.

In the unfolded state, the USB connector 10 stands on the socket 50, the first bolt 60 is positioned at the second rounded end 1342, and the second bolt 70 is positioned at the fourth rounded end 1353. The sliding cap 33 is pushed away from the USB connector 10 until the restraining blocks 3211 engage with the restraining groove 332. In this way, the sliding cap 33 is restrained to move to allow the USB connector 10 to fold (as detailed below). In this state, the first spring 15 and the third spring 35 can be in their natural unstressed states. Alternatively, the first spring 15 and the third spring 35 can be twisted. The first spring 15 exerts a force to cause the USB connector 10 to rotate away from the latch 30. The third spring 35 exerts a force to cause the restraining rod 32 to move towards the sliding cap 33. The second spring 34 is compressed.

When the USB connector 10 is not being used it can be rotated towards the second rung 52. The first bolt 60 slides in the first slot 134 and the third slot 144 from the second rounded end 1342 to the first rounded end 1341, and the second bolt 70 slides in the second slot 135 from the fourth rounded end 1353 to the third rounded end 1351, until the front end 111 presses the pressing block 3221. The third spring 35 is twisted or further twisted by pressing the pressing block 322, the restraining rod 32 is pulled down to the second rung 52, and the restraining blocks 3211 disengage from the restraining groove 332. Accordingly, the sliding cap 33 is released and slides on the rail 3112 towards the USB connector 10 as the second spring 34 restores, until the sliding cap 33 engages and thus latches the USB connector 30 in a folded state.

To unfold the USB connector 10, the sliding cap 33 can be pulled away from the USB connector 10 until the sliding cap 33 disengages from the USB connector 20 and the restraining blocks 3211 engage the restraining groove 332.

In alternative embodiment, the restraining blocks 3211 can be two parts of one piece.

It will be understood that the above particular embodiments are shown and described by way of illustration only. The principles and the features of the present disclosure may be employed in various and numerous embodiments thereof without departing from the scope of the disclosure as claimed.

The above-described embodiments illustrate the possible scope of the disclosure but do not restrict the scope of the disclosure.

What is claimed is:

1. A USB flash drive, comprising:
a USB connector comprising a body and a first spring, the body comprising a front end and a back end;
a latch comprising a base, a sliding cap, a restraining rod, a second spring, and a third spring, the sliding cap defining a restraining groove at an end thereof, the restraining rod comprising a pressing block and two restraining blocks at two opposite ends thereof; and
a socket;
the back end being rotatably connected to the socket, the first spring being configured for driving the body to rotate from a folded state of the USB flash drive in which the front end is received in the socket to an unfolded state of the USB flash drive in which the front end is out of the socket;
the base being connected to the socket at a side of the front end when the USB flash drive is in the folded state, the sliding cap being slidably capped on the base in such a way that the restraining groove is positioned adjacent to the USB connector, the restraining rod being slidably attached to the base in such a way that the pressing block is adjacent to the socket and the restraining block engages with the restraining groove when the USB flash drive is in the unfolded state, the pressing block being configured for bringing the restraining rod to move toward the socket as being pressed by the front end when the USB flash drive changes from the unfolded state to the folded state to disengage the restraining block from the restraining groove, the second spring being configured for driving the sliding cap to slide on the base toward the USB connector and thus latch the USB connector after the restraining block disengages from the restraining groove, the third spring being configured for driving the restraining rod to move towards the sliding cap until the restraining block engages with the restraining groove when the sliding cap is pulled to unlatch the USB connector.

2. The USB flash drive of claim 1, wherein the body further comprises two parallel connecting plates protruding from the back end, each connecting plate is generally a right triangle in shape and comprises a first right-angle side, a second right-angle side, and a hypotenuse, the first right-angle sides are connected to the back end, each connecting plate defines a first shaft hole at an intersection corner of the second right-angle side and the hypotenuse, the first shaft holes are aligned with each other, and the body are rotatable about the first shaft holes.

3. The USB flash drive of claim 2, wherein the body further comprises a first limiting plate and a second limiting plate, the first limiting plate is a semi-sleeve, and is positioned between the connecting plates, and sleeves a half circumference of each first shaft hole that is distant from the back end, and the second limiting plate is a flat plate, and is positioned between the connecting plates, and perpendicularly connect the two second right-angle sides, closing to the first shaft holes, and the first spring placed into a space which is defined by the first limiting plate and the second limiting plate and aligned with the first shaft holes.

4. The USB flash drive of claim 3, wherein the first spring is a coil torsional spring and comprises a first longitudinal end and a first transverse end, the first transverse end abuts against the second limiting plate, the first longitudinal end protrude out of one of the first shaft holes.

5. The USB flash drive of claim 4, wherein USB connector further comprises a shell for enclosing the body.

6. The USB flash drive of claim 5, wherein the shell comprises a first part and a second part, the first part is substantially a rectangular plate and comprises a rectangular first surface and a plurality of ears perpendicularly extending up from two long sides of the first surface, each ear defines an engaging groove that is elongated and extends along a direction that is substantially parallel to the long sides of the first surface, the second part comprises a bottom plate and two sidewalls, the bottom plate is essentially similar to the first surface in shape and size, the sidewalls extend up from two long sides of the bottom plate, and the second part further comprises a plurality of engaging protrusions protruding from the sidewalls and engaging with the respective engaging grooves to combine the first par and the second part and thus enclose the body.

7. The USB flash drive device of claim 6, wherein the first part also defines a first slot and a second slot, the first slot is aligned with the first shaft holes, and positioned adjacent to a corner of the first part, and extends along a direction that is substantially parallel to a lengthwise direction of the first surface, and comprises a first rounded end closing the corner of the first part and a second rounded end opposite to the first rounded end, the second slot is positioned adjacent to one of the long sides of the first surface that is distant from the first slot and extends along a direction that is substantially perpendicular to the long sides of the first surface, the second slot comprises a third rounded end adjacent to the first slot and a fourth rounded end opposite to the third rounded end, the bottom plate defines a third slot that corresponds to the first slot in position, shape, and size.

8. The USB flash drive of claim 7, further comprising a first bolt that defines a loading groove at one end thereof and extending along a longitudinal direction thereof, the first bolt inserts through the first slots and the first shaft holes, and the first longitudinal end is limited in the loading groove.

9. The USB flash drive of claim 8, wherein the base comprises a first block, a second block, and a third block, all of which are rectangular, the second block extends up from an end of the first block, and the third block extends up from an end of the second block that is distant from the first block and extending away from the first block, the sliding cap is capped on the first block, and the restraining rod is attached to the second block.

10. The USB flash drive of claim 9, wherein the first block comprises a second surface facing away from the third block and defines a first receiving groove in the second surface, adjacent to the second block, the first block further comprises a rail, protruding from the second surface away from the second block, the first receiving groove is elongated and positioned adjacent to the second block, generally at a central portion of the width of the second surface, the first receiving groove runs along a lengthwise direction of the first block and out of the first block, the rail is elongated and has a T-shaped cross section, the rail is positioned away from the second block, generally at a central portion of the width of the second surface, and extends along the lengthwise direction of the first block, the second spring is received in the first receiving groove, the sliding cap rids on the rail, one end of the second spring abuts against an inner surface of the first receiving groove, and the other end of the second spring connects to the sliding cap.

11. The USB flash drive of claim 10, wherein the second block comprises a third surface that is substantially perpendicular to the second surface and faces away from the first block, the second block defines a second receiving groove in the third surface, the second receiving groove is elongated and extends through the second block, along a length direction of the second block and generally at a central portion of the width of the third surface, and thus communicates with the first receiving groove, and the restraining rod is slidably received in the second receiving groove.

12. The USB flash drive of claim 11, wherein the third block comprises a fourth surface that is perpendicularly connecting with the third surface and comprises a fastener-receiving portion extending up from the fourth surface, adjacent to the second block and at a central portion of the width of the fourth surface, the third block is fixed to the socket by inserting a fastener through the socket and into the fastener-receiving portion.

13. The USB flash drive of claim 12, wherein the first block is hollow and defines a cavity, the cavity is located beneath the first receiving groove at an intersection of the first and second blocks, the base also comprises two holding pins received in the cavity and extending up from an inner wall of the cavity, adjacent to the intersection of the first block and the second block, the holding pins extend along a direction that is substantially parallel to a line of the intersection between the first block and the second block, the second block is also hollow, the base also defines an opening in the third surface, which communicates with the interior of the second block and the cavity, adjacent to the intersection of the first block and the second block.

14. The USB flash drive of claim 13, wherein the third spring is a coil torsional spring and comprises a second longitudinal end and a second transverse end, the third spring is coiled on the holding pins, the second longitudinal end protrude through the opening and limited by the restraining rod, and the second transverse end abuts the first block.

15. The USB flash drive of claim 14, wherein the sliding cap is generally a rectangular block, corresponding to the first block in shape and size, the sliding cap comprises a fifth surface and defines a third receiving groove in the fifth surface, the third receiving groove is rectangular and runs through the sliding cap along the lengthwise direction of the sliding cap, the third receiving groove is bounded by a bottom surface that is substantially parallel to the fifth surface and two side surfaces extending up from two long sides of the bottom surface, the sliding cap also comprises two riding protrusions protruding from the respective side surfaces, aligning with edges of the side surfaces that is distant from the bottom surface and adjacent to an end of the sliding cap, the two riding protrusions engage with the rail, the sliding cap also comprises a separating plate positioned generally at a central portion of the length of the third receiving groove, perpendicularly connecting the bottom surface and the two side surfaces, the sliding cap also comprises a holding rod extending up from the separating plate toward the riding protrusions, along a direction that is substantially perpendicular to the separating plate and has a "+" shaped cross section, the second spring is a coil spring, one end of the second spring is held by the holding rod, the restraining groove is defined in the fifth surface, adjacent to an end that is distant from the riding protrusions, the restraining groove is elongated and extends through the sliding cap along a direction that is substantially perpendicular to the lengthwise direction of the third receiving groove.

16. The USB flash drive of claim 15, wherein the restraining rod is T-shaped and comprises a first rod and a second rod extending up from a central portion of the first rod, the first rod comprises a sixth surface and the two restraining blocks, the sixth surface is rectangular and faces away from the second rod, the two restraining blocks extend up from two lengthwise ends of the sixth surface, the second rod comprises a seventh surface and the pressing block, the seventh surface is rectangular, and substantially perpendicular to the sixth surface, the pressing block extends up from a lengthwise end of the seventh surface that is distant from the first rod, the second rod also comprises two eighth surfaces and two wings, the two eighth surfaces are substantially perpendicular to the sixth surface and perpendicularly connect the seventh surface, the two wings extend up from the respective eighth surfaces, and the second rod along with the wings are slidably received in the second receiving groove.

17. The USB flash drive of claim 16, wherein the restraining rod also comprises a connecting block, the connecting block is positioned at an intersection between the first rod and the second rod that is opposite to the seventh surface, the connecting block is a rectangular and comprises a ninth surface opposite to the seventh surface and defines a limiting groove in a central portion of an edge of the ninth surface that is distant from the first rod and the second rod, the limiting groove is elongated and extends along a direction that is substantially perpendicular to the ninth surface, and the second transverse end is limited in the limiting groove.

18. The USB flash drive of claim 17, wherein the socket is ladder-shaped and comprises a first rung, a second rung, and a third rung, which are all rectangular and arranged from up to bottom, the socket also comprises two connecting pieces, one of the connecting pieces connects the first rung and the second rung, the other of the connecting pieces connects the second rung and the third rung, the socket also comprises a first support plate and a second support plate respectively extending up from two long sides of the third rung, the first block is fixed to the first rung, the second block is attached the connecting piece which connects the first rung and the second rung, the third block is positioned on the second rung when the USB flash drive is in the folded state, and the back end and the shell are positioned between the first support plate and the second support plate and rotatably connected thereto.

19. The USB flash drive of claim 18, wherein the first support plate and the second support plate are both rectangular and lengthwise directions thereof are substantially perpendicular to the third rung, the first support plate defines a second shaft hole and a third shaft hole, the second shaft hole is positioned away from the third rung in the lengthwise direction of the first support plate and generally at a central portion in a widthwise direction of the first support plate, the third shaft hole is positioned adjacent to the second rung in the widthwise direction of the first support plate and generally at a central portion in the lengthwise direction of the support plate, the second support plate defines a fourth shaft hole which is aligned with the second shaft hole and comprises a tongue extending into the third shaft hole from a side adjacent to the third rung and toward a side that is far away from the third rung, the first bolt also inserts through the second and fourth shaft holes, the tongue is received in the loading groove, and the USB flash drive also comprises a second bolt insert through the third shaft hole and into the second slot.

* * * * *